US010108148B1

(12) United States Patent
Testi

(10) Patent No.: US 10,108,148 B1
(45) Date of Patent: Oct. 23, 2018

(54) TIME TO DIGITAL CONVERTER WITH INCREASED RANGE AND SENSITIVITY

(71) Applicant: Innophase Inc., San Diego, CA (US)

(72) Inventor: Nicolo Testi, San Diego, CA (US)

(73) Assignee: INNOPHASE INC., San Diego, CA (US)

( * ) Notice: Subject to any disclaimer, the term of this patent is extended or adjusted under 35 U.S.C. 154(b) by 0 days.

(21) Appl. No.: 15/488,278

(22) Filed: Apr. 14, 2017

(51) Int. Cl.
*H03M 1/12* (2006.01)
*G04F 10/00* (2006.01)

(52) U.S. Cl.
CPC .................................. *G04F 10/005* (2013.01)

(58) Field of Classification Search
CPC ........................... G04F 10/005; H03M 7/3084
USPC ............................ 341/50, 51, 155, 144, 156
See application file for complete search history.

(56) References Cited

U.S. PATENT DOCUMENTS 4,271,412 A 6/1981 Glass
4,322,819 A 3/1982 Hyatt
5,325,095 A 6/1994 Vadnais
5,493,581 A 2/1996 Young
5,635,864 A 6/1997 Jones
6,161,420 A * 12/2000 Dilger .................... G01R 23/10 73/23.21
6,369,659 B1 4/2002 Delzer
6,556,636 B1 4/2003 Takagi
6,587,187 B2 * 7/2003 Watanabe ............... G01S 7/493 342/118
6,975,165 B2 12/2005 LopezVillegas
7,042,958 B2 5/2006 Biedka
7,095,274 B2 8/2006 LopezVillegas
7,332,973 B2 * 2/2008 Lee ....................... G04F 10/005 327/12
7,447,272 B2 11/2008 Haglan
(Continued)

FOREIGN PATENT DOCUMENTS

JP 07221570 8/1995
JP 11088064 3/1999
(Continued)

OTHER PUBLICATIONS

International Search Report and Written Opinion for PCT/US2014/026459 dated Jul. 28, 2014.
(Continued)

*Primary Examiner* — Jean B Jeanglaude
(74) *Attorney, Agent, or Firm* — Invention Mine LLC

(57) ABSTRACT

Systems and methods are provided for converting time measurements to digital value representing phase. Such systems and methods use a ring oscillator to create a coarse measurement of the time difference between first and second rising edges of a modulated signal. A two-dimensional Vernier structure is used to create a fine resolution measurement of the error in the coarse measurement. The coarse and fine measurements are combined to calculate a digital time measurement. A digital time output is calculated as the difference in successive digital time measurements. An offset digital time output is calculated as a difference in a digital time output in relation to a carrier period offset. The offset digital time output is scaled and accumulated to calculate the integrated time signal. The integrated time signals are synchronized to the carrier frequency to output a series of final phase measurements.

19 Claims, 8 Drawing Sheets

(56) References Cited

U.S. PATENT DOCUMENTS

| | | | |
|---|---|---|---|
| 7,564,929 B2 | 7/2009 | LopezVillegas | |
| 7,773,713 B2 * | 8/2010 | Cafaro | H04L 7/0331 327/156 |
| 7,888,973 B1 * | 2/2011 | Rezzi | H03L 7/085 327/105 |
| 8,421,661 B1 | 4/2013 | Jee | |
| 8,498,601 B2 | 7/2013 | Horng | |
| 8,666,325 B2 | 3/2014 | Shute | |
| 8,804,875 B1 | 8/2014 | Xu | |
| 8,854,091 B2 | 10/2014 | Hossain | |
| 9,083,588 B1 | 7/2015 | Xu | |
| 9,178,691 B2 * | 11/2015 | Shimizu | H04B 1/7073 |
| 9,240,914 B2 * | 1/2016 | Yao | H04L 27/0014 |
| 9,497,055 B2 | 11/2016 | Xu | |
| 9,673,828 B1 | 6/2017 | Xu | |
| 9,673,829 B1 | 6/2017 | Xu | |
| 2001/0001616 A1 | 5/2001 | Rakib | |
| 2002/0132597 A1 | 9/2002 | Peterzell | |
| 2003/0053554 A1 | 3/2003 | McCrokle | |
| 2004/0036538 A1 | 2/2004 | Devries | |
| 2004/0100330 A1 | 5/2004 | Chandler | |
| 2005/0285541 A1 | 12/2005 | LeChevalier | |
| 2006/0285541 A1 | 12/2006 | Roy | |
| 2008/0112526 A1 * | 5/2008 | Yi | H03D 13/004 375/376 |
| 2008/0150645 A1 | 6/2008 | McCorquodale | |
| 2008/0192872 A1 | 8/2008 | Lindoff | |
| 2008/0192877 A1 | 8/2008 | Eliezer | |
| 2008/0205709 A1 * | 8/2008 | Masuda | G01S 7/491 382/106 |
| 2008/0220735 A1 | 9/2008 | Kim | |
| 2008/0291064 A1 | 11/2008 | Johansson | |
| 2011/0019657 A1 * | 1/2011 | Zaher | H04L 25/03834 370/342 |
| 2011/0050296 A1 | 3/2011 | Fagg | |
| 2011/0159877 A1 | 6/2011 | Kenington | |
| 2011/0260790 A1 | 10/2011 | Haddad | |
| 2011/0298557 A1 * | 12/2011 | Kobayashi | H04L 27/362 332/103 |
| 2011/0299632 A1 | 12/2011 | Mirzaei | |
| 2011/0300885 A1 | 12/2011 | Darabi | |
| 2012/0074990 A1 | 3/2012 | Sornin | |
| 2012/0256693 A1 | 10/2012 | Raghunathan | |
| 2012/0306547 A1 | 12/2012 | Arora | |
| 2013/0143509 A1 | 6/2013 | Horng | |
| 2013/0257494 A1 | 10/2013 | Nikaeen | |
| 2014/0023163 A1 | 1/2014 | Xu | |
| 2014/0133528 A1 | 5/2014 | Noest | |
| 2014/0185723 A1 | 7/2014 | Belitzer | |
| 2014/0269999 A1 | 9/2014 | Cui | |
| 2015/0180685 A1 | 6/2015 | Noest | |
| 2015/0207499 A1 | 7/2015 | Homg | |

FOREIGN PATENT DOCUMENTS

| | | |
|---|---|---|
| JP | 1187313 | 3/2002 |
| WO | 2012132847 | 4/2012 |

OTHER PUBLICATIONS

Henzler, S., "Time-to_Digital Converters", Springer Series in Advanced Microelectronics 29, DOI, 10.1007/978-90-481-8628-0_2, copyright Springer Science+Business Media B.V. 2010, Chapter 2, pp. 15 pages.

Lin, et al., "Single-Stage Vernier Time-to-Digital Converter with Sub-Gate Delay Time Resolution", Circuits and Systems, 2011, 2, 365-371, Oct. 2011.

Nazari, et al., "Polar Quantizer for Wireless Receivers: Theory, Analysis, and CMOS Implementation", IEEE Transactions on Circuits and Systems, vol. 61, No. 3, Mar. 2014.

Jovanovic, et al., "Vernier's Delay Line Time-to-Digital Converter", Scientific Publications of the State University of Novi Pazar, Ser. A: Appl. Math. Inform. and Mech., vol. 1, 1 (2009), pp. 11-20.

Dudek, et al., "A High-Resolution CMOS Time-to-Digital Converter Utilizing a Vernier Delay Line", IEEE Transactions on Solid-State Circuits, vol. 35, No. 2, Feb. 2000.

Effendrik, P., "Time-to-Digital Converter (TDC) for WiMAX ADPLL in State-of-The-Art 40-nm CMOS", MSc Thesis, Apr. 18, 2011, 80 pages.

Jose Maria Lopez-Villegas et al., BPSK to ASK Signal Conversion Using Injection-Locked Oscillators—Part I: Theory, Dec. 2005, IEEE Transactions on Microwave Theory and Techniques, vol. 53, No. 12, available online at: http://diposit.ub.edu/dspace/bitstream/2445/8751/1/529612.pdf.

International Search Report for PCT/US2013/024159 dated Apr. 9, 2013.

N. Siripon, et al., Novel Sub-Harmonic Injection-Locked Balanced Oscillator, Microwave and Systems Research Group (MSRG), School of Electronics, Computing and Mathematics, University of Surrey, Sep. 24, 2011, 31st European Microwave Conference.

Hamid R. Rategh, et al., Superharmonic Injection Locked Oscillators as Low Power Frequency Dividers, Stanford University, Stanford, California.

Behzad Razavi, A Study of Injection Pulling and Locking in Oscillators, Electrical Engineering Department, University of California, 2003, IEEE, Custom Integrated Circuits Conference.

Marc Tiebout, A 50GHz Direct Injection Locked Oscillator Topology as Low Power Frequency Divider in 0.13 ?? μm CMOS, Infineon Technologies AG, Solid-State Circuits Conference, 2003, pp. 73-76, 29th European ESSCIRC.

Pei-Kang Tsai, et al., Wideband Injection-Locked Divide-by-3 Frequency Divider Design with Regenerative Second-Harmonic Feedback Technique, RF@CAD Laboratory, Department of Electrical Engineering, National Cheng Kung University, Tainan, Taiwan 2009.

Chi-Tsan Chen et al., Wireless Polar Receiver Using Two Injection-Locked Oscillator Stages for Green Radios, IEEE MTT-S International, Jun. 2011.

International Search Report and Written Opinion for PCT/US2014/030525 dated Jul. 24, 2014.

Aeroflex, Application Note, Measurement of Frequency Stability and Phase Noise, Feb. 2007, part No. 46891/865.

Hewlett Packard, Phase Noise Characterization of Microwave Oscillators, Frequency Discriminator Method, Sep. 1985, USA.

Paul O'Brien, A Comparison of Two Delay Line Discriminator Implementations Ireland.

Claude Frantz, Frequency Discriminator, published 1994.

International Search Report and Written Opinion for PCT/US2014/029055 dated Sep. 15, 2014.

Electronic Warfare and Radar Systems Engineering Handbook, Mixers and Frequency Discriminators, Section 6-8.1 to 6-8.2, Apr. 1, 1999, Naval Air Systems Command and Naval Air Warfare Center, USA.

Putnam, William, and Julius Smith, "Design of fractional delay filters using convex optimization" (1997 IEEE ASSP Workshop on Applications of Signal Processing to Audio and Acoustics).

Notification of Transmittal of the International Search Report and The Written Opinion of the International Searching Authority, or The Declaration, for PCT/US16/53484, dated Dec. 19, 2016, 8 pages.

Chi-Tsan Chen, Cognitive Polar Receiver Using Two Injection-Locked Oscillator Stages, IEEE Transactions on Microwave Theory and Techniques, vol. 59, No. 12, Dec. 2011.

Notification of Transmittal of The International Search Report and The Written Opinion of the International Search Authority, or the Declaration, dated Feb. 28, 2017, 7 pages.

William Putnam , Julius Smith, "Design of Fractional Delay Filters Using Convex Optimization", Department of Electrical Engineering and, Center for Research in Music and Acoustics (CCRMA), Stanford University, Stanford, CA 34305-8180, Oct. 1997.

Antonio Liscidini, Luca Vercesi, and Rinaldo Castello, "Time to Digital Converter based on a 2-dimensions Vernier architecture", University of Pavia Via Ferrata 1, 27100 Pavia, Italy; Sep. 13, 2009.

(56) References Cited

OTHER PUBLICATIONS

Jianjun Yu and Fa Foster Dai, "A 3-Dimensional Vernier Ring Time-to-digital converter in 0.13 μm CMOS", Electrical and Computer Engineering, Auburn University, Auburn, AL 36849, USA, Sep. 19, 2010.
William Putnam, Julius Smith, "Design of Fractional Delay Filters Using Convex Optimization", Department of Electrical Engineering and Center for Research in Music and Acoustics (CCRMA) Stanford University Stanford, CA M305-8180. Published in IEEE: workshop on applications of signal processing to audio and acoustics; Oct. 1997.
Dongyi Liao, et al., "An 802.11a/b/g/n Digital Fractional-N PLL With Automatic TDC Linearity Calibration for Spur Cancellation", IEEE Journal of Solid-State Circuits, 0018-9200 © 2017 IEEE.
Renaldi Winotol, et al. "A 2x2 WLAN and Bluetooth Combo SoC in 28nm CMOS with On-Chip WLAN Digital Power Amplifier, Integrated 2G/BT SP3T Switch and BT Pulling Cancelation", ISSCC 2016 / Session 9/ High-Performance Wireless / 9.4, 2016 IEEE International Solid-State Circuits Conference.
Stefano Pellerano, at al. "A 4.75-GHz Fractional Frequency Divider-by-1.25 With TDC-Based All-Digital Spur calibration in 45-nm CMOS", 3422 IEEE Journal of Solid-State Circuits, vol. 44, No. 12, Dec. 2009.
Jianjun Yu and Fa Foster Dai, "A 3-Dimensional Vernier Ring Time-to-digital converter in 0.13 μm CMOS", Electrical and Computer Engineering, Auburn University, Auburn, AL 36849, USA.
Antonio Liscidini, Luca Vercesi, and Rinaldo Castello, "Time to Digital Converter based on a 2-dimensions Vernier architecture", University of Pavia Via Ferrata 1, 27100 Pavia, Italy.
William Putnam, Julius Smith, "Design of Fractional Delay Filters Using Convex Optimization", Department of Electrical Engineering and Center for Research in Music and Acoustics (CCRMA), Stanford University, Stanford, CA 94305-8180.
International Search report and Written Opinion for PCT/US18/27222 dated Jun. 28, 2018.
International Preliminary Report on Patentability for PCT/US2016/064772 dated Jun. 14, 2018.

* cited by examiner

TIME TO DIGITAL CONVERTER WITH INCREASED RANGE AND SENSITIVITY

BACKGROUND

Time to Digital Converters (TDC) are generally used to provide a digital output representing a timing value. A typical TDC circuit measures a time difference between two events: a start and a stop event. In its simplest form, a counter updates based on a high frequency oscillator running at a frequency $f_0$. The counter updates once every period $$\left(\frac{1}{f_0}\right).$$

The TDC circuit initiates the counter when the start event occurs. The TDC reads the state of the counter when the stop event occurs and stores the value as the stop counter value. The count value, in conjunction with the counter update rate $$\left(\text{or the period}\left(\frac{1}{f_0}\right)\right)$$

may be used to determine the time difference between the start and stop events.

SUMMARY

In one example embodiment, a TDC uses a combination of coarse and fine measurements to obtain a time measurement. In a further embodiment, the TDC is used within a demodulator of a low power receiver. In some applications, the receiver is a low power, high performance RF system on-chip (SoC) using nanometer technology that features a low, core supply voltage. Taking advantage of nanometer process technology, the receiver's integrated circuit (IC) implements various levels of digital tuning to optimize the analog/RF performance. This specification describes an example receiver's Time to Digital Converter (TDC) to demodulate a received signal, where the demodulation may include removal of the carrier period, scaling and accumulation of the result, and a resampler, which in some embodiments uses a First In, First Out (FIFO) memory in conjunction with a sampling timer circuit.

A receiver time signal is converted to a digital word using coarse and fine TDC components. The coarse TDC portion uses a ring oscillator to calculate a coarse estimate of the length of time delay. The fine TDC portion uses a two-dimensional Vernier structure to calculate a fine resolution estimate of coarse measurement error. The system combines the coarse measurement with the fine measurement to calculate the digital time measurement. The system further processes the output word to handle counter rollover, to prepare a result at the proper sampling times for the baseband read circuit, to remove the carrier period offset, and to scale the resulting signal. For an example receiver, the resulting signal is stored in a FIFO and read from the FIFO when needed by a baseband circuit.

In one example embodiment, a coarse measurement circuit measures a coarse measurement of the time period between a first rising edge and a second rising edge of the modulated signal. In one non-limiting example, it operates for input periods between 2.5 ns and 5 ns. Those periods correspond to input frequencies between 200 MHz and 400 MHz. The Rx TDC comprises a coarse TDC, a fine TDC, and some digital reconstruction circuits. A coarse and fine structure is used in order to meet the desired range and resolution requirements. In the receiver, the coarse TDC generally takes care of the range, while the fine TDC generally takes care of the resolution.

The coarse TDC provides a first coarse measurement of the input period. For one example embodiment, a coarse TDC resolution is 160 ps, and it is based on a ring oscillator-type TDC. At every input rising edge, the system probes the state of the ring oscillator and generates the signals to be passed to the fine TDC circuit. The coarse measurement of the input period is achieved by analyzing the state of the ring oscillator chain and the counters connected to it. Because the ring oscillator in one embodiment avoids resetting during operation, its output corresponds to the accumulation of the sequence of input periods.

The fine TDC provides a finer measurement of the input period and serves as an error measurement of the coarse measurement. In one embodiment, it comprises a two-dimensional Vernier structure. The coarse TDC generates the input signals to be injected into the fine TDC's slow and fast delay lines. The input signals to the fine TDC are (i) the rising edge of the received modulated signal (suitably delayed) and the corresponding output of a coarse TDC ring oscillator element. The fine measurement happens after the coarse measurement has finished. The fine TDC operates on an edge injected into the slow line, which will take longer to propagate than an edge injected into the fast line. Based on where in the corresponding arbiter's grid the edge injected in the fast delay line catches up to the edge injected in the slow delay line, the system calculates the fine TDC value. The system combines the coarse measurement and the fine measurement to obtain the final measurement. In one example embodiment, a receiver's fine measurement circuit uses twelve 50 ps delays in the slow line and nine 45 ps delays in the fast line. The arbiter matrix uses five Vernier lines to provide a range of 240 ps and a resolution of 5 ps. The topology of the Rx TDC allows a wide input range (2.5 ns to 5 ns) with a small resolution size (5 ps). Each consecutive measurement corresponds to the accumulation of all the input periods up to that moment.

DETAILED DESCRIPTION

In one example embodiment, an Rx TDC covers a large range (several nanoseconds) with a small resolution ($5\times10^{-12}$ seconds or 5 ps). Various embodiments use a sequence of coarse and fine time measurements to meet the range and resolution usage. Starting with a signal previously processed by other elements of a receive circuit (which will be labeled as the modulated signal), various circuits described herein make a coarse estimate of the period. The circuit makes a fine resolution estimate of the error. The system combines these coarse and fine measurements to arrive at an estimate of the input signal's period. Further processing occurs to convert the time measurement to a phase measurement.

Figure 1:
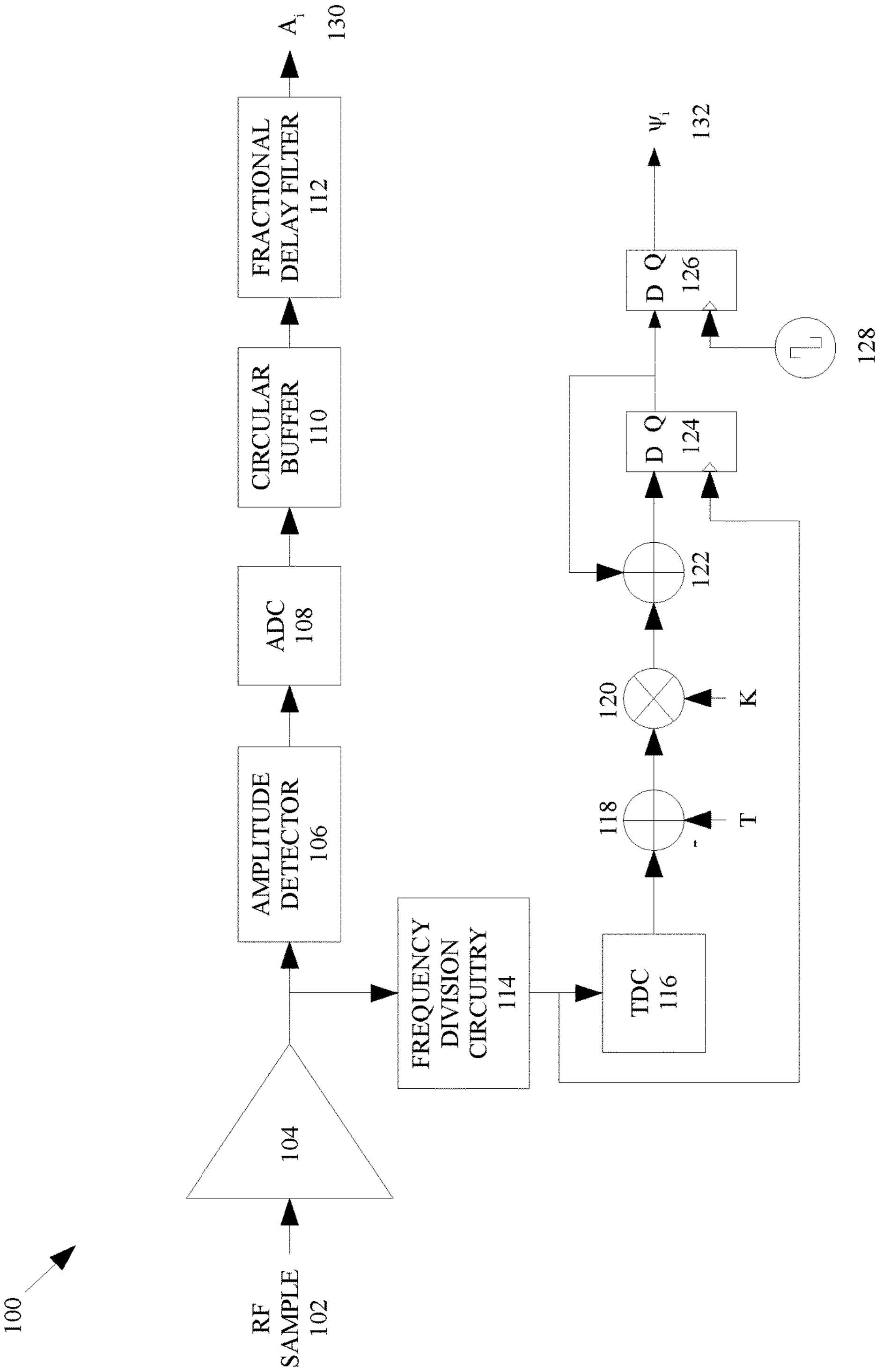
FIG. 1 is a block diagram of a polar receiver.

FIG. 1 is a block diagram of an example polar receiver. A radio frequency signal 102 is received by a polar receiver 100 and may be amplified by an amplifier 104. The polar receiver 100 operates to receive and decode modulated radio-frequency signals, such as signals modulated using phase shift keying (PSK) or quadrature amplitude modulation (QAM). The amplifier's output signal connects to separate paths for amplitude and phase.

The amplitude path starts with an amplitude detector 106 such as an envelope detector or a power detector, which operates to provide a signal representing the amplitude of the modulated radio-frequency signal. The amplitude detector 106 may operate using various techniques such as, for example, signal rectification followed by low-pass filtering. The amplitude signal goes through an analog-to-digital converter (ADC) 108. The ADC operates to generate a series of digital amplitude signals representing the amplitude of the sampled radio-frequency signal. In some embodiments, ADC 108 samples the amplitude of the modulated radio-frequency signal at 160 Msps. The ADC's output is stored in a circular buffer 110. Samples stored in the circular buffer are read and delayed via a fractional delay filter 112 and outputted as amplitude sample $A_i$ 130.

The polar receiver 100 is provided with frequency division circuitry 114. In addition, a limiter circuit (not shown) may be used to remove any amplitude information from the signal but which preserves the phase information. In some embodiments, and ILO may be used to remove the amplitude information. The frequency division circuitry has an input for receiving the sampled radio-frequency input signal from the buffer 104 and a frequency-divided output for providing a frequency-divided output signal to a trigger input of a time-to-digital converter (TDC) 116. The frequency division circuitry operates to divide the frequency of the input signal by a frequency divisor. In some embodiments, the frequency division circuitry can be implemented using a harmonic injection-locked oscillator, a digital frequency divider, or a combination thereof, among other possibilities. The frequency division circuitry 114 also acts as an amplitude normalization circuit.

For the phase path, the amplifier's output connects to frequency division circuitry 114 that divides the frequency (by 4 in one embodiment). The frequency division output signal goes into the time-to-digital (TDC) 116 to calculate a digital time output. The time-to-digital converter 116 operates to measure a characteristic time of the frequency-divided signal, such as the period of the frequency-divided signal. The time-to-digital converter 116 may operate to measure the period of the frequency-divided signal by measuring an elapsed time between successive corresponding features of the frequency-divided signal. For example, the time-to-digital converter may measure the period of the frequency-divided signal by measuring a time between successive rising edges of the frequency-divided signal or the time between successive falling edges of the frequency-divided signal. In alternative embodiments, the time-to-digital converter may measure a characteristic time other than a complete period, such as an elapsed time between a rising edge and a falling edge of the frequency-divided signal.

Figure 7:
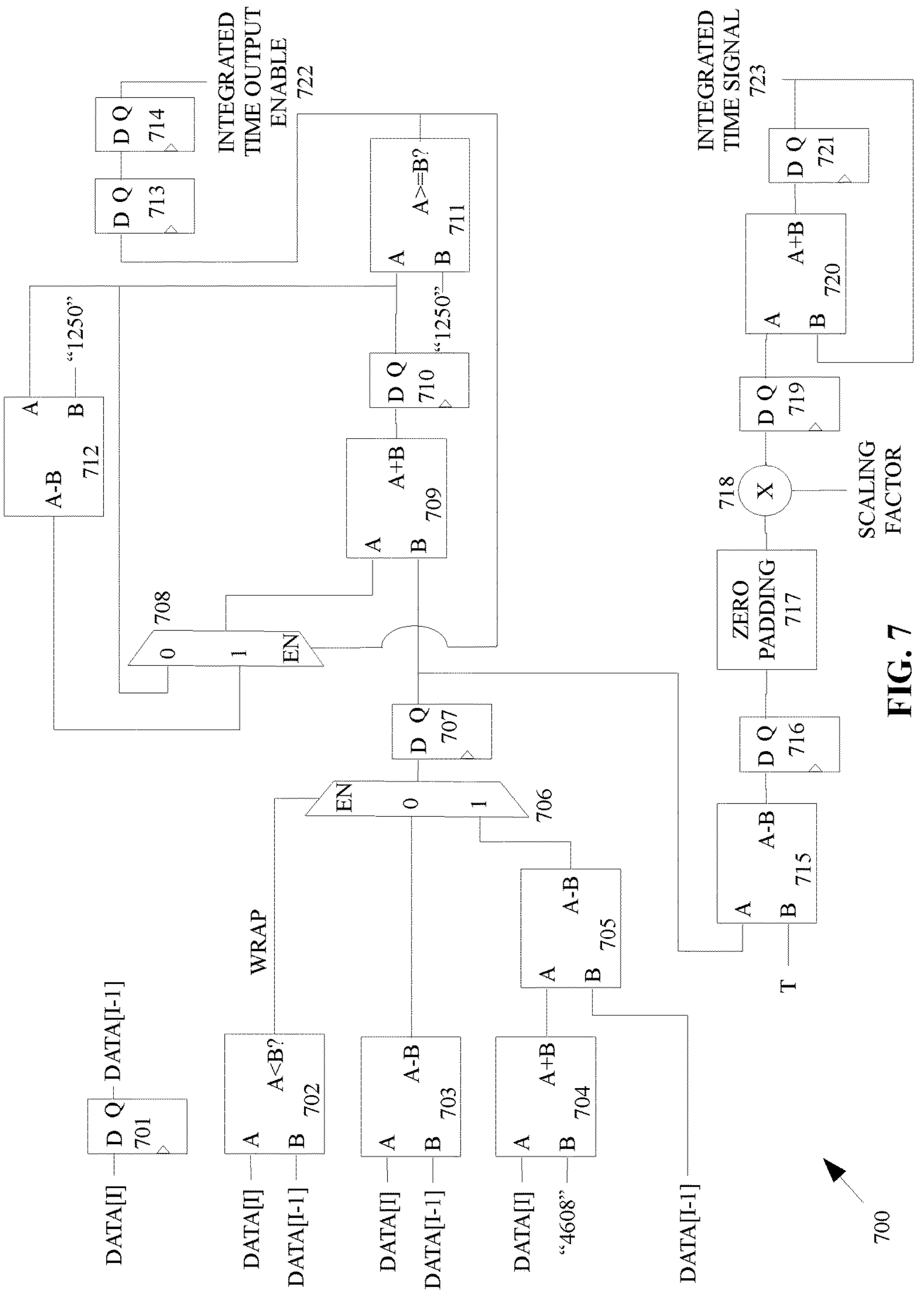
FIG. 7 is a digital component block diagram of signal processing performed on a digital time measurement.

In some embodiments, the time-to-digital converter 116 operates without the use of an external trigger such as a clock signal. That is, the time-to-digital converter 116 measures the time between two features (e.g., two rising edges) of the frequency-divided signal rather than the time between an external trigger signal and a rising edge of the frequency-divided signal. Because the start and end of the time period measured by the time-to-digital converter 116 are both triggered by the frequency-divided signal, rather than an external clock signal, the time-to-digital converter 116, is referred to as a self-triggered time-to-digital converter. In the example of FIG. 7, the self-triggered time-to-digital converter 116 provides a digital time output that represents the period of the frequency-divided output signal.

The carrier period offset (T) is subtracted from the digital time output by adder 118. The offset digital time output is thus at or near zero when no shift is occurring in the phase of the frequency-divided signal. When a phase shift does occur in the sampled radio-frequency signal (a phase-modulated or frequency modulated carrier signal), this results in a temporary change in the period of the sampled radio-frequency signal, which in turn causes a temporary change in the period of the frequency-divided signal. This temporary change in the period of the frequency-divided signal is measured as a temporary change in the digital time output (and in the offset digital time output). In some embodiments, the offset digital time output is at or near zero during periods when the phase of the modulated radio-frequency signal remains steady, while a shift in the phase of the modulated radio-frequency signal results in the offset digital time output signal briefly taking on a positive or negative value, depending on the direction of the phase shift.

The offset digital time output may be scaled by a scaling factor via a multiplier 120. The scaled digital time signal (or offset digital time output in some embodiments) is accumulated by adder 122 and register 124. The digital integrator generates an integrated time signal. The register 124 may be clocked using the frequency-divided signal, resulting in an addition per cycle of the frequency-divided signal. In embodiments in which the offset digital time output signal represents a change in the phase of the sampled radio-frequency signal, the integrated time signal provides a value that represents the current phase of the sampled radio-frequency signal.

The accumulated value goes through another register 126 to be read at the appropriate time based on the input pulse 128. In some embodiments, the register 126 operates to sample the integrated time signal at 160 Msps, although other sampling rates may alternatively be used. The output is a phase sample $\psi_i$ 132. In the embodiment of FIG. 7, frequency division circuitry 114, TDC 116, subtractor 118, multiplier 120, adder 122, and registers 124 and 126 operate as a phase detection circuit operative to generate a series of digital phase signals representing the phase of the sampled signal.

Figure 2:
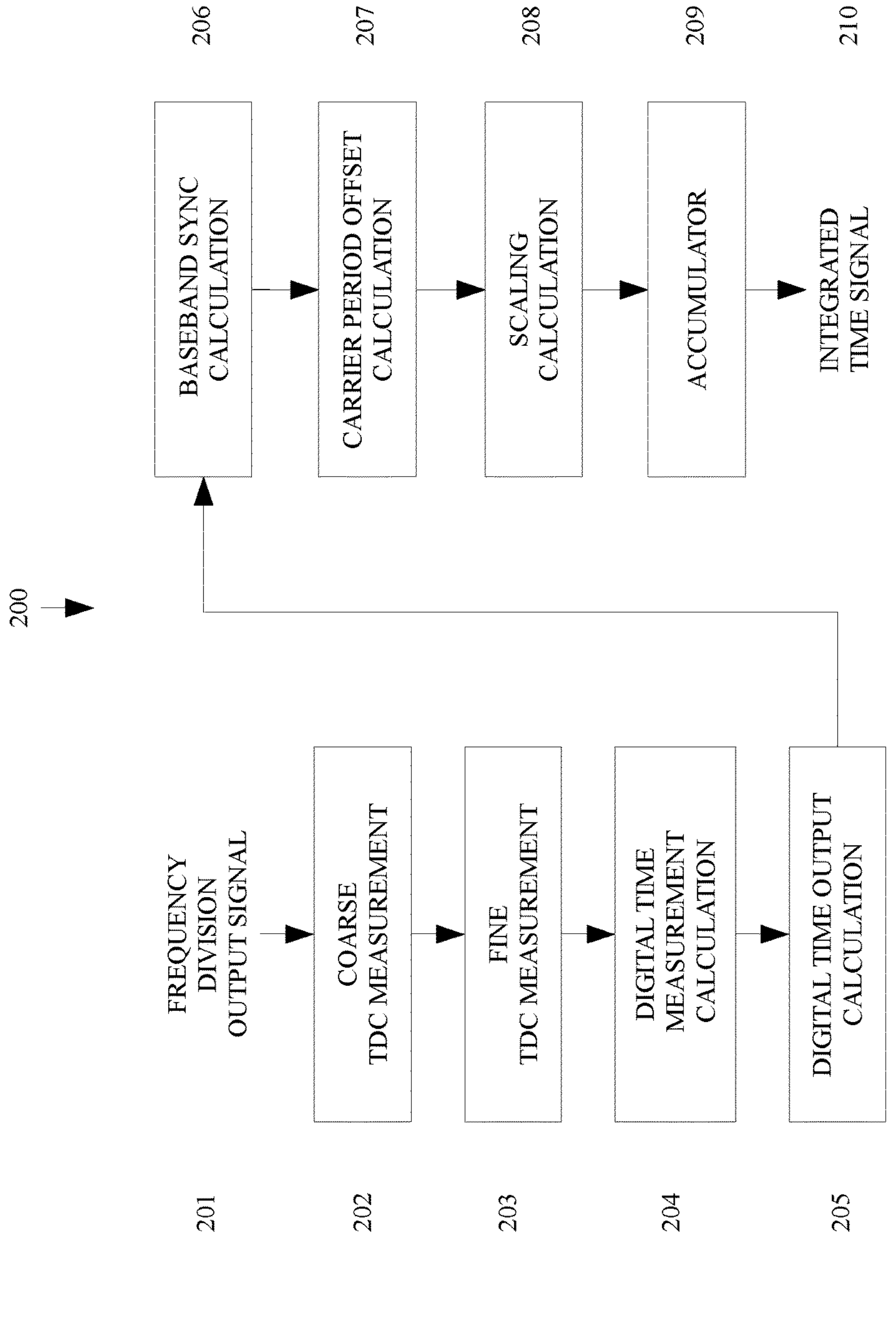
FIG. 2 is a flowchart of a detailed Time-to-Digital Conversion (TDC) method and post-processing actions.

FIG. 2 is a block diagram of the processes executed to convert a time to a digital value and further calculate a phase of the original modulated signal. The frequency division output signal 201 corresponds to the input signal into the TDC block 116 shown on FIG. 1. In other embodiments, a frequency division operation is not used. The frequency division output signal is the input to the coarse TDC measurement block 202. The circuit calculates a coarse estimate of the elapsed time between a coarse measurement start signal and a coarse measurement stop signal. This coarse estimate may include an error amount due to the quantization size of the coarse measurement. The fine TDC measurement block 203 calculates an estimate of the error, and this error value is subtracted from the coarse measurement value with the coarse+fine measurement calculation 204. The digital time output goes into the digital time output calculation block 205 to check for wrapping of the value based on the maximum counter values used in the coarse measurement calculations. The system uses the output of this check to perform the 160 MHz baseband synchronization calculation 206. The polar receiver 100 uses phase calculations at certain times, and the 160 MHz baseband synchronization calculation compares the digital time output to a reference value corresponding to the 160 MHz baseband period. The output of the 160 MHz baseband synchronization calculation (integrated time output enable) is used to determine the appropriate time to read the integrated time signal 210. The offset digital time output calculation 207 subtracts the carrier period offset from the digital time output. The offset digital time output is scaled by the scaling calculation 208. The scaled digital time signal is accumulated by the accumulator circuitry 209. The integrated time signal 210 is read at the appropriate time based on the integrated time output enable.

Figure 3:
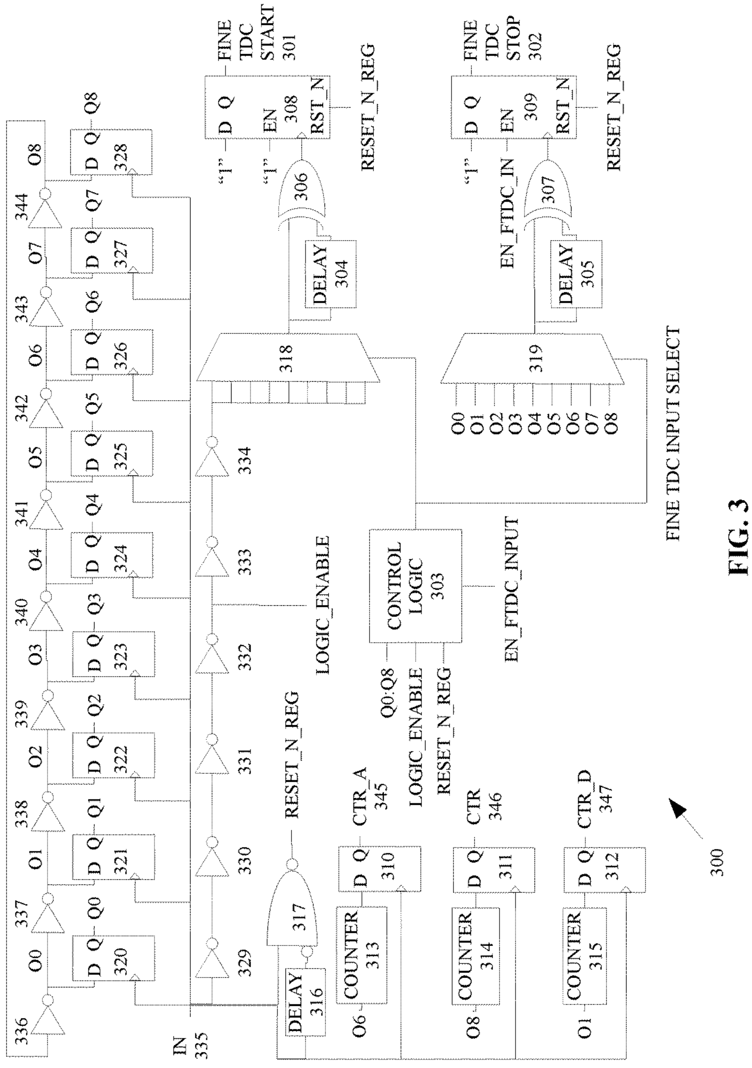
FIG. 3 is a block diagram of a coarse estimate for a TDC.

FIG. 3 is the block diagram of an example coarse measurement circuit. The coarse estimate starts with a ring oscillator. FIG. 3 is an example embodiment where the ring oscillator contains nine inverting elements. Noting the inverse relationship between frequency and time, the ring oscillator's oscillation frequency is:

$$f_{RO} = \frac{1}{2*9*t_{delay,element}},$$

where $t_{delay\ element}$ is the delay of one of the nine elements of the ring oscillator.

A modulated signal with a first and second rising edge is received at the input node 335. The first and second rising edge signals are elements of the modulated signal. At each rising edge, the TDC circuit latches the output values of each element forming a ring oscillator. Each element in the ring oscillator outputs an inverted version of its input signal. When the input changes state, it takes time for the output to reflect that change. The location of the propagation edge in the ring oscillator is the inverter stage where the input and output are in the process of moving to opposite states. The system counts the number of complete oscillations of the ring and combines it with the present state of the ring oscillator to calculate a coarse estimate of the period of the modulated signal. One example method to determine generally complete oscillations of the ring is to increment a counter each time a particular inverter changes state. This specification discusses in later sections both determination of complete oscillations of the ring and calculation of a coarse estimate. The resolution of the coarse estimate for one example embodiment is the length of delay of an inverter stage because the coarse estimate circuit does not probe into the internal circuit of the inverter.

Choosing the delay for each element of the ring oscillator to be a power of 2 times the fine TDC resolution may reduce the number of digital logic components used to combine the coarse and fine measurements. Minimizing the fine TDC's range may decrease power consumption. The delay of each element of the ring oscillator also sets the minimum range of the fine TDC. The fine TDC typically consumes more power than the coarse TDC, though for some embodiments, the fine TDC may consume less power than the coarse TDC. Picking a larger delay for each element in the ring oscillator may reduce the number of ring oscillator stages. Using a lower oscillation frequency may reduce power consumption. Also, picking a lower oscillation frequency allows the coarse TDC control logic to settle earlier in the ring oscillator cycle. Limiting the number of elements may reduce logic complexity and save circuit board layout space.

For one example receiver, these constraints and other factors (for example, cost and availability) led to a choice of $T_{delay\ element}$ equal to $2^5*5$ ps, which equals 32*5 ps or 160 ps. Hence, the frequency of the ring oscillator ($f_{RO}$) became 347.222 MHz.

FIG. 3's example embodiment connects the output of each ring oscillator inverter 336 to 344 into a D-flip-flop 320 to 328. The circuit uses the D-flip-flop outputs to store the state of each stage of the ring oscillator when the modulated signal has a rising edge. The circuit uses as the pulse-propagating inverter the inverter having a non-inverted latched output value. Depending on whether the ring oscillator is in the first half of an oscillation or the second half, the inverter of the ring's propagation stage may have its input and output both low or both high.

The example receiver circuit uses three counters 313 to 315 to record complete oscillations of the ring. Each of these counters connects to the output of a different stage in the ring. Because the rising edge of the modulated signal is asynchronous to the ring oscillator, the rising edge may arrive at any moment. Such an edge may occur at the same moment a ring oscillator stage counter updates. Using three counters makes sure a counter not in the process of updating will have enough settle time before probing it. One example embodiment uses the counter of a desired stage within the ring and two back-up counters two stages before and two stages after the desired measurement stage. Using counters positioned two delays apart allows the system to use stage outputs that will be in the same state after the propagation edge passes through both stages. Such a configuration ensures that at least two of the counters will be in the same state. The logic circuit for an example receiver picks which counter to use based on the location of the ring oscillator's propagation edge signal. If the propagation edge of the ring oscillator is currently at the same position as the desired counter, the logic uses one of the other two counters. Another example method may use a counter's value as the number of complete oscillations of the ring oscillator if it matches at least one other counter. Yet another example method may use a desired counter unless the propagation edge of the ring oscillator is at the same location of the desired counter or one position prior, in which case the system may use the back-up counter.

One embodiment may use two counters to count the number of complete oscillations of the ring oscillator. For this embodiment, a first counter is incremented when an output of a first inverter of the ring oscillator changes state. Likewise, a second counter is incremented when an output of a second inverter of the ring oscillator changes state. The circuit selects a count value from either the first or second counter based on the location of the pulse-propagating inverter in relation to the first and second inverters.

Using the position of the edge inside the ring oscillator, the system decides which of the three counters to use. For an example receiver, the counter at O1 (oscillator 1) has a count one more than the other two because its count is incremented as soon as the ring oscillator is enabled. If the edge is in the second half of the oscillation ring, the system may use the O1 counter 315 because the O1 counter has settled correctly. If the edge is in the first half of the oscillation ring, the system may use the O6 counter because the O6 counter has settled correctly. An exception occurs when the edge starts another oscillation and its position is 0. That position may be considered the first half of the oscillation, but sometimes the advanced counter (O6) 313 lacks enough time to settle. In those situations, the system selects the delayed counter (O1), but the +1 count may not be removed. Other embodiments may use different stage counters without changing the general principles.

Using ongoing counters avoids resetting the circuit after each coarse measurement. Each time a measurement is made, there is an error. Embodiments that accumulate the results in subsequent signal processing may accumulate those errors over a long time may become a large error and too big for the system to handle. Using a ring oscillator with ongoing counters allows the errors to cancel each other over a long period of time. The measurement error connects back directly into the system, and each new measurement remains within the resolution boundaries.

Generating input signals for the fine measurement takes time for the control logic to read and process the state of the ring oscillator. When the modulated signal arrives with a rising edge, an example receiver changes the D-flip-flop outputs to match the output signal for each stage of the ring oscillator. A signal corresponding to a received modulated signal also goes through delay elements 329 to 334 corresponding to the circuit's processing time for determining the location of the propagating edge in the ring oscillator circuit. The signal corresponding to the modulated signal goes through six inverters 329 to 334 that correspond to the delay of six stages in the ring oscillator. The fine measurement circuit uses as its fine measurement start signal the modulated signal delayed through six inverters (329 to 334), a multiplexer 318, and associated signaling components (304, 306, and 308). For the fine measurement stop signal, the receiver uses the ring oscillator inverter output signal for six stages past the location of the propagation edge. The fine measurement circuit uses a multiplexer 319 to pick the appropriate ring oscillator inverter stage output signal for the fine measurement stop signal. The fine measurement stop signal propagates through a set of signaling components (305, 307, and 309) similar to the fine measurement start signal. The fine resolution measurement calculates the difference between the fine measurement start and stop signals.

In one embodiment, the fine measurement start signal for a Vernier comparator circuit is the rising edge of the modulated signal. The fine measurement stop signal is selected to provide a delayed coarse measurement signal to a Vernier comparator circuit using a control logic circuit and a multiplexer. In one embodiment, the control logic circuit controls the multiplexer to select a comparator located a predetermined number of delay elements past the pulse-propagating inverter. In one embodiment, initiating the Vernier comparator circuit using the rising edge of the delayed coarse measurement signal comprises delaying the rising edge signal by using a multiplexer and a predetermined number of delay elements.

For example, if the ring oscillator state corresponds to the propagation edge being inside stage one, using control logic 303, a delay 316, a NAND gate 317, and a multiplexer 319, the circuit selects the ring oscillator element corresponding to stage seven (six stages later). The output signal of multiplexer 319 is the fine measurement stop signal 302. The circuit also delays the coarse measurement start signal six stages to create the fine measurement start signal 301. An example receiver delays the modulated signal six delay stages to put the fine measurement start signal 301 in the proper time frame for use with the fine measurement stop signal 302. Both signals go through matched components prior to propagating through the fine measurement circuit. For one example receiver, those components are a multiplexer (318 and 319), an XOR gate (306 and 307), a delay element (304 and 305), and a D-flip-flop (308 and 309), as shown in FIG. 3. The delayed coarse measurement signal is processed by a delay element and an XOR gate to generate a trigger upon either a rising edge or a falling edge of the delayed coarse measurement signal. The delay element (304 and 305) and the XOR gate (306 and 307) create short pulses for the fine measurement start and stop signals. The short pulses connect into the clock signals of D-flip-flops (308 and 309). The D-flip-flops output high signals as long as the associated enable signal is high and reset signal is low. Hence, the fine measurement start and stop signals 301 and 302 are edge signals.

Figure 4:
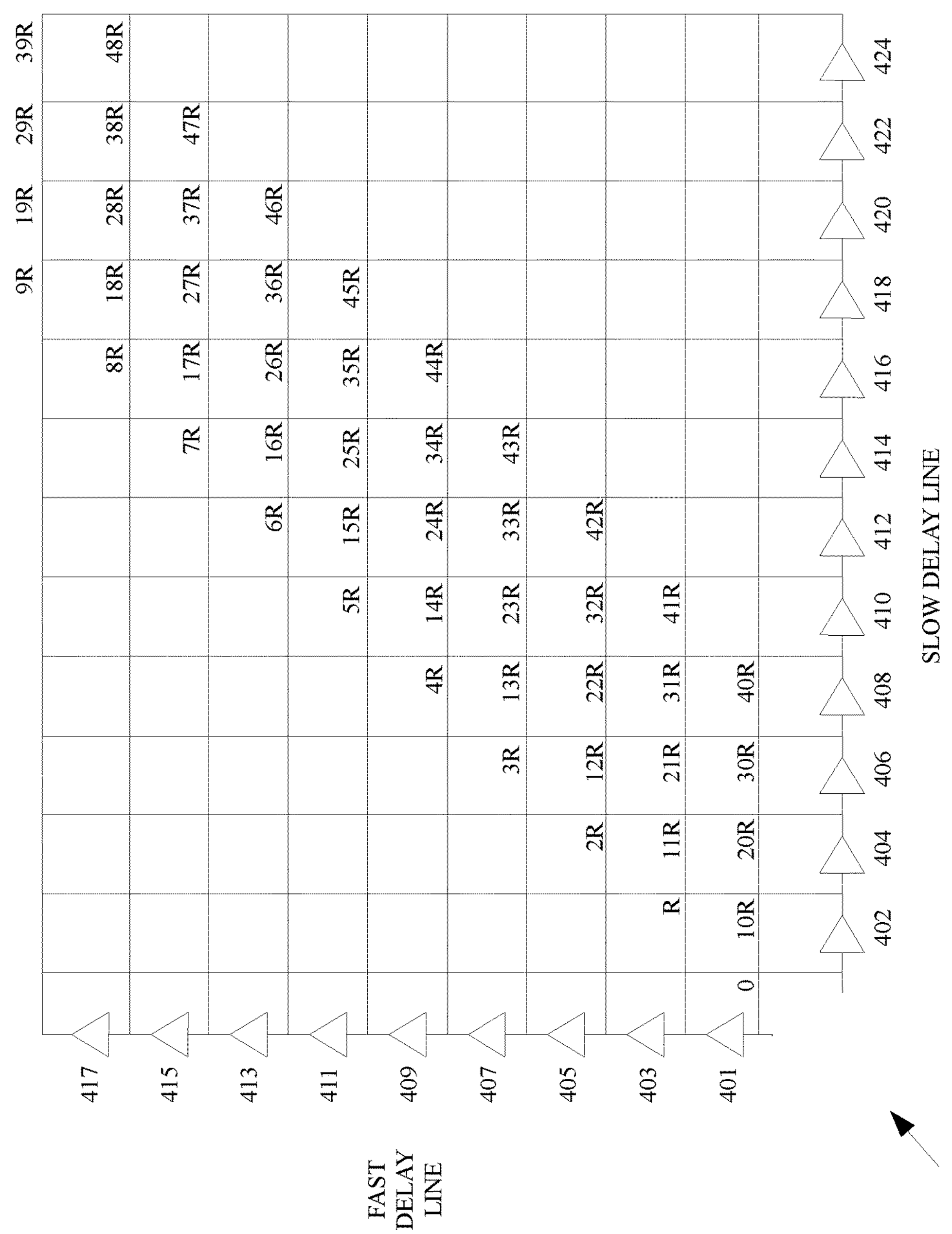
FIG. 4 is a block diagram of a two-dimensional Vernier time to digital converter.

FIG. 4 is a graphical example of how the fine measurement two-dimensional Vernier works. The system uses the two-dimensional Vernier circuit to estimate the error of the coarse measurement. It uses two sets of delay lines: one fast delay line and one slow delay line. One embodiment uses a set of one or more inverters 401 to 424 for each of these delay lines. The fine measurement start signal progresses through the slow line, while the fine measurement stop signal travels through the fast line. For an example receiver, a matrix of SR latches compares the delay line intersections of interest. For one embodiment, the matrix's size is equal to the number of inverters in the fast delay line times the number of inverters in the slow delay line. Using an SR latch as the arbiter, each fast line inverter output is connected to the S input for a row of SR latches in the matrix. Each slow line inverter output is connected to the R input for a column of SR latches in the matrix. Each SR latch outputs a high signal if the S input goes high while the R input stays low. When no edge is propagating through the delay lines, all delay cell outputs stay low, and all arbiter outputs remain high. This configuration means that the output of the arbiter goes high when the associated fast line pulse arrives at the arbiter before the associated slow line pulse. The fine TDC circuit detects this condition where the fast line pulse arrives first. When the second rising edge reaches the arbiter, its output is on hold and the result is not affected. Resetting the delay lines also resets the arbiters.

In one embodiment, calculation of the fine resolution measurement of the coarse measurement error comprises propagating a rising edge of the modulated signal (fine measurement start signal) through a first line of delay elements. The delayed coarse measurement signal (fine measurement stop signal) propagates through a second line of delay elements, where the first line of delay elements is slower than the second line of delay elements. A matrix of arbiters form a two-dimensional Vernier structure. Using the matrix of arbiters, a fine measurement point is determined to be a smallest arbiter location at which the fine measurement stop signal arrives at the arbiter location before the fine measurement start signal. An arbiter location identifier is calculated as the time difference for a signal to propagate through the corresponding portion of the first line of delay elements and the corresponding portion of the second line of delay elements. A first arbiter location is determined to be smaller than a second arbiter location if the first arbiter's time difference is smaller than the second arbiter's time difference. One embodiment outputs the fine resolution measurement as the fine measurement point.

One example receiver uses a two-dimensional Vernier structure 400 as shown in FIG. 4. The receiver's two-dimensional Vernier structure uses twelve slow delay elements 402, 404, 406, 408, 410, 412, 414, 416, 418, 420, 422 and 424 (each with 50 ps of delay), nine fast delay elements 401, 403, 405, 407, 409, 411, 413, 415, and 417 (each with 45 ps of delay), five Vernier lines, and forty-nine arbiters.

The fast delay line uses inverters with a shorter delay than the inverters used in the slow delay line. For one example receiver, the fast delay line uses inverters 401, 403, 405, 407, 409, 411, 413, 415, and 417 with a delay of 45 ps. The slow delay line uses inverters 402, 404, 406, 408, 410, 412, 414, 416, 418, 420, 422 and 424 with a delay of 50 ps. At each intersection of interest in FIG. 4, there is a value written as a multiple of R. The letter "R" represents the difference in delay for one delay element from the fast delay line and one delay element from the slow delay line. For one example receiver, the difference between these values is 5 ps (50 ps minus 45 ps). Hence, for the receiver, R is 5 ps. The values shown at the intersections of interest range from zero to 48R. Replacing the R with a value of 5 ps, FIG. 5's two-dimensional Vernier structure may resolve measurement errors from zero (OR) to 240 ps (48R).

Consider the intersection near the center of FIG. 4 that says "24R." The inputs to the SR latch that correlates to this intersection travel through six elements of delay on the slow delay line and four elements of delay on the fast delay line. For one example receiver embodiment, the slow delay line input experiences a delay of 6*50 ps=300 ps. The fast delay line input experiences a delay of 4*45 ps=180 ps. The difference between these values is 120 ps. Dividing this value by 5 ps (the value for R), produces a value of 24R. One calculates the values shown at the intersections of interest in FIG. 4 using calculations similar to the ones shown in this example.

Figure 5:
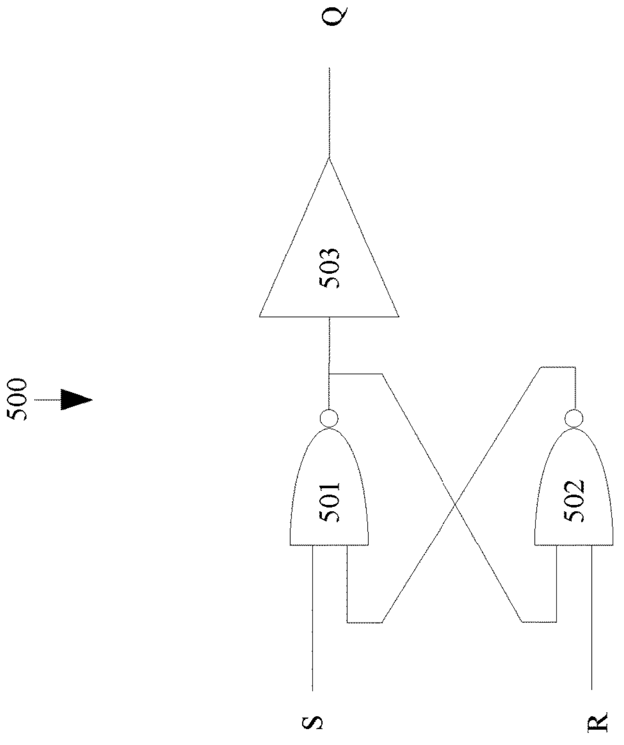
FIG. 5 is a block diagram of an arbiter circuit.

At each intersection shown with an "R" label on FIG. 4, there is an arbiter circuit to determine if the signal from the slow delay or the signal from the fast delay line propagated through the location first. FIG. 5 is one embodiment of such an arbiter circuit. The fast delay line at an arbiter location connects to an S input, which connects to NAND gate 501. The slow delay line at an arbiter location connects to an R input, which connects to NAND gate 502. The output of NAND gate 501 connects as an input to NAND gate 502 and as input to amplifier 503. Likewise, the output of NAND gate 502 is an input to NAND gate 501. The output of the amplifier is a signal Q.

When S is the low state ("0") and R is in the high state ("1"), Q is in the high state ("1"). When both S and R are in the high state, Q retains the same value it had previously. If S is high and R is low, Q is in the low state. With no rising edge propagating through either the fast or slow delay lines, both S and R equal 0, so Q starts as a 1. If the rising edge of the slow delay line arrives first at the arbiter location, the arbiter output Q stays as a 1. If the rising edge of the fast delay arrives first at the arbiter location, the arbiter output Q changes to a 0.

To further explain how the two-dimensional Vernier structure works, consider an example where the edges for the fine measurement start and stop signals differ by 194 ps. For the 38R intersection, the fine measurement start signal going through the slow delay line travels through eleven slow delay elements, which corresponds to a delay of 550 ps (11*50 ps). The fine measurement stop signal going through the fast delay line travels through eight fast delay elements, which corresponds to a delay of 360 ps (8*45 ps). The difference in these two lines corresponds to 190 ps (550 ps minus 360 ps). The slow delay line propagation edge beats the fast delay line propagation edge to the input of the arbiter (an SR latch for an example receiver), and the arbiter's output for 38R remains high.

For the 39R intersection, the fine measurement start signal going through the slow delay line travels through eleven slow delay elements, which corresponds to a delay of 600 ps (12*50 ps). The fine measurement stop signal going through the fast delay line travels through nine fast delay elements, which corresponds to a delay of 405 ps (9*45 ps). The difference in these two lines corresponds to 195 ps (600 ps minus 405 ps). The fast delay line propagation edge arrives prior to the slow delay line propagation edge at the input of the arbiter, and the arbiter's output for 39R goes low. For the 40R and higher intersections, the fast delay line propagation edge arrives prior to the slow delay line propagation edge at the input of the arbiter, and each of those arbiter outputs also goes low.

An example arbiter circuit (shown in FIG. 5) is used at each arbiter location. A Vernier two-dimensional structure circuit compares each arbiter location output with a low state and stores the lowest difference location (lowest multiple of R) where the fast delay line propagation edge signal arrived at the corresponding arbiter input before the slow delay line propagation edge signal. The system uses this lowest difference amount as the fine measurement.

The fine TDC resets after each measurement. When the edge propagating into the slow delay line reaches the end of the line, a reset pulse is generated. The reset pulse brings the fine measurement start and stop signals low, which propagates along the slow and fast lines. At the same time, this operation resets the arbiters.

Figure 6:
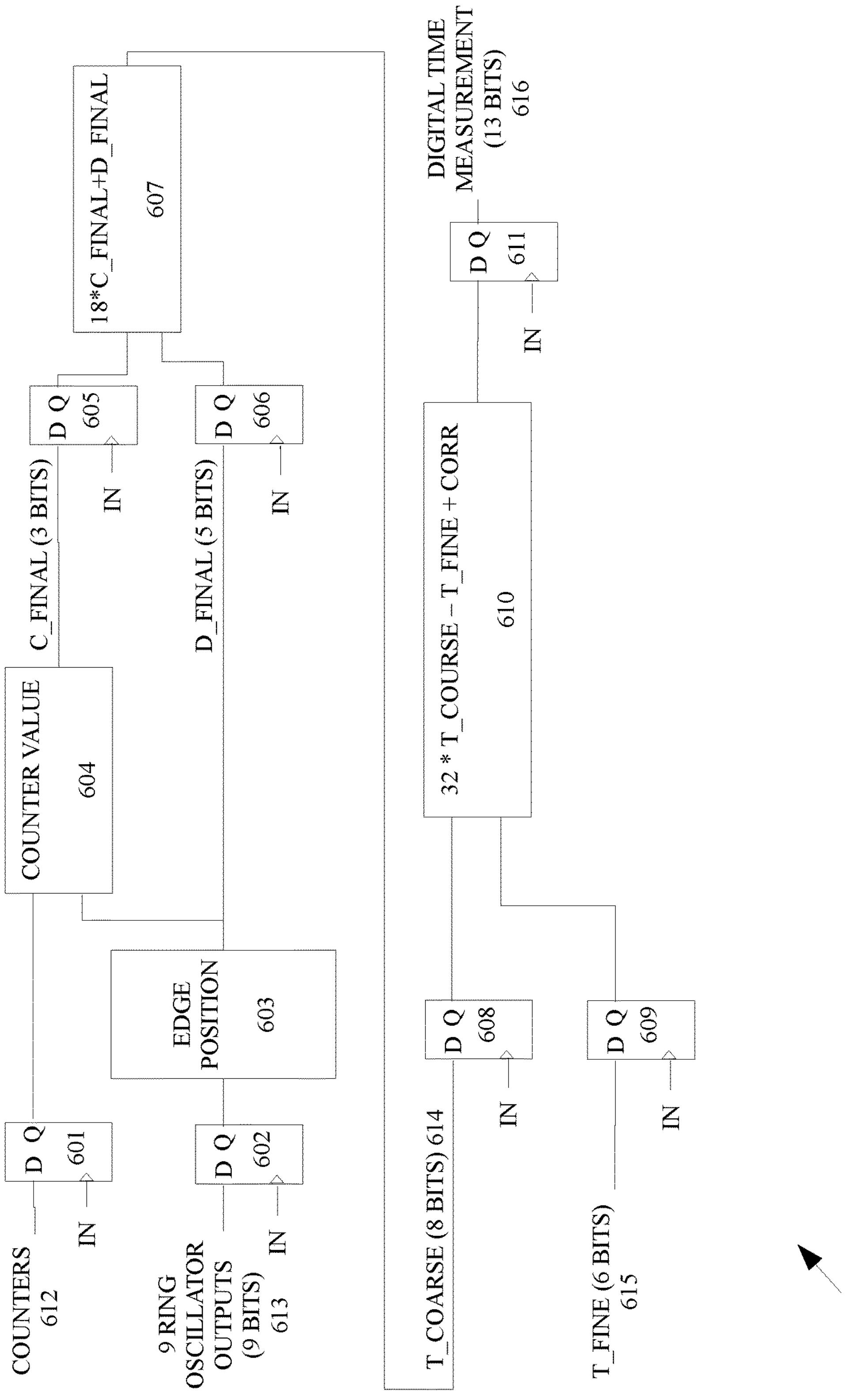
FIG. 6 is a block diagram of the combining of a coarse measurement and fine measurement

FIG. 6 is a block diagram of one embodiment of digital logic used to reconstruct the period of the TDC input from the coarse and fine measurements. The example coarse TDC circuit uses three counter outputs (345, 346, and 347) that connect as three counter signals 612 to three D-flip-flops 601. The output of each D-flip-flop connects to the counter value logic block 604. The counter value logic block outputs a coarse measurement and connects it to a D-flip-flop 605. The D-flip-flop's output connects to the coarse measurement logic block 607. The D-flip-flops create pipelined stages to provide for additional processing time, in other embodiments, pipeline stages are not used.

Nine D-flip flop outputs, stored as a nine-bit ring oscillator register value 613, hold the state of each stage in the ring oscillator. The nine-bit ring oscillator outputs register 613 connects to a D-flip-flop 602. The output of the D-flip-flop 602 connects to the edge position logic block 603. The edge position logic block calculates the location of the propagating edge in the ring oscillator circuit. The output of the edge position logic block connects to the counter value logic block 604 and to a D-flip-flop 606. The output of the D-flip-flop connects to the logic block 607.

The coarse measurement logic block 607 calculates the coarse measurement of the input period 614 and uses this value as the input to D-flip-flop 608. The output of the D-flip-flop is used as an input to the overall measurement logic block 610. The fine TDC measurement 615 is the input to D-flip-flop 609. The output of the D-flip-flop is an input to the overall measurement logic block 610 that calculates the overall measurement of the input period. The overall measurement of the input period is used as an input to a D-flip-flop 611. The output of the D-flip-flop is the digital time measurement 616.

Using the position of the edge and the correct counter output, the coarse measurement is obtained. For one example receiver, the ring oscillator contains 9 stages and 18 delay elements in a full oscillation cycle. Hence, the coarse TDC measurement is calculated as:

$$T_{coarse}=18*C_{final}+D_{final}.$$

The coarse TDC measurement is calculated as the time of a measured amount of complete oscillations of the ring ($18*C_{final}$) plus a current propagation time ($D_{final}$).

The resolution of the coarse TDC is 160 ps, which is 32 times the fine TDC resolution. Hence, the digital time measurement is:

$$TDC_{OUTPUT}=32*T_{coarse}-T_{fine}+\text{Corr}.$$

A digital time measurement ($TDC_{OUTPUT}$) is calculated as a coarse measurement count ratio (32) times the coarse measurement time ($T_{coarse}$) minus the fine resolution measurement ($T_{fine}$) plus a calibration correction factor (Corr). The calibration correction factor depends on which edge the coarse TDC used to compute its value. Rising and falling edges have slightly different delays within the several gates, so a correction is applied to obtain an accurate result.

The predetermined number of delay elements equals the maximum coarse measurement logic processing time divided by a unit delay time of a ring oscillator delay element. For one example receiver, the predetermined number of delay elements is six. The multiplexer input select value equals the pulse-propagating inverter's stage position plus the predetermined number of delay elements. The multiplexer input select value is decremented by the total number of ring oscillator elements if the multiplexer input select value exceeds the total number of ring oscillator inverters. The coarse measurement count ratio is the unit delay time divided by the difference of a Vernier slow delay element and a Vernier fast delay element. For one example receiver, the coarse to fine measurement count ratio is $$\frac{160 \text{ ps}}{(50 \text{ ps} - 45 \text{ ps})} = 32.$$

FIG. 7 is a functional block diagram that shows the circuit blocks for calculation of the phase of the modulated signal based on the digital time measurement. The output of FIG. 6 for one example receiver is a 13-bit digital time measurement. This value serves as the input for FIG. 7. The first circuit block 701, 702, 703, 704, 705, 706, and 707 (digital time difference circuit) subtracts the previous digital time measurement from the present digital time measurement to calculate a period difference value. Circuit block 703 shows this calculation. If the previous digital time measurement exceeds the present digital time measurement, the digital time measurement wrapped past the maximum value. In such a situation, the circuit adds a counter wrapping value to the present digital time measurement and subtracts the previous digital time measurement. Circuit blocks 702, 704, and 705 show these calculations. The circuit in FIG. 7 delays one stage period the output of this difference calculation via, for example, a D-Flip-flop 707. For one example circuit, logic components 701 to 707 perform these comparisons and delay functions. For one example receiver, the wrap-over value is 4608. To calculate this limit, take the coarse counters' 8 possible values ($2^3$) times the 18 ring-oscillator stages times the coarse to fine measurement resolution ratio, 32. The result of this first circuit block is a period difference signal that is a difference in successive digital time measurements.

The second circuit block 708, 709, 710, 711, 712, 713, and 714 (baseband output time circuit) handles the baseband signal's 160 MHz read rate. The circuit block uses a feedback loop to add successive outputs of the first circuit block. If the successive additions exceed the output time threshold (1250), the output time threshold is subtracted from the feedback value and an output write signal goes high two stage periods later. The receiver uses the digital time output to reconstruct a 160 MHz timeline. The output time threshold (1250) corresponds to a 160 MHz read period with a 5 ps digital time output resolution value $$\left(\frac{1}{160 \text{ MHz} * 5 \text{ ps}}\right).$$

Every time the sum of consecutive periods exceeds 1250 (output time threshold), the baseband circuit samples the value. When such a condition occurs, the integrated time output enable 722 goes high two stages later, indicating an output time to write the phase of the modulated signal, the integrated time signal 723.

The third circuit block 715, 716, 717, 718, 719, 720, and 721 of FIG. 7 (offset digital time output circuit) handles subtracting a carrier period offset T from the first circuit block's output (digital time output) and scaling the result. The carrier period offset circuit subtracts off the carrier period offset for the offset digital time output calculation. The carrier period offset, T, is calculated as ($f_c$ is the carrier frequency):

$$T = \frac{8}{f_c * TDC_{resolution}}$$

The scaling circuit scales the offset digital time output to the desired level. The coarse TDC circuit accumulates the scaled digital time signal so that its error stays within the fine TDC measurement resolution. The scaling factor is calculated as:

$$\text{Scaling factor}=1024*f_c*TDC_{resolution}.$$

The factor 1024 is because the phase $2\pi$ is mapped to 10 bits. An accumulating circuit accumulates a value as the final output of the phase demodulator circuit. The offset digital time output calculation and post-processing delay may be performed by circuit components 715 and 716. Scaling and post-processing delay may be performed by circuit components 717, 718, and 719. Accumulation of the scaled digital time signal and post-processing delay may be performed by circuit components 720 and 721 to output the integrated time signal 723.

One example receiver embodiment uses a FIFO to handle the baseband signal's 160 MHz read clock being asynchronous with the TDC circuit's output write clock of up to 400 MHz. The TDC circuit writes successive output values to a FIFO using a clock (TDC input signal) of up to 400 MHz at a rate set by the integrated time output enable signal 722, while the baseband circuit reads values at a rate of 160 MHz.

Figure 8:
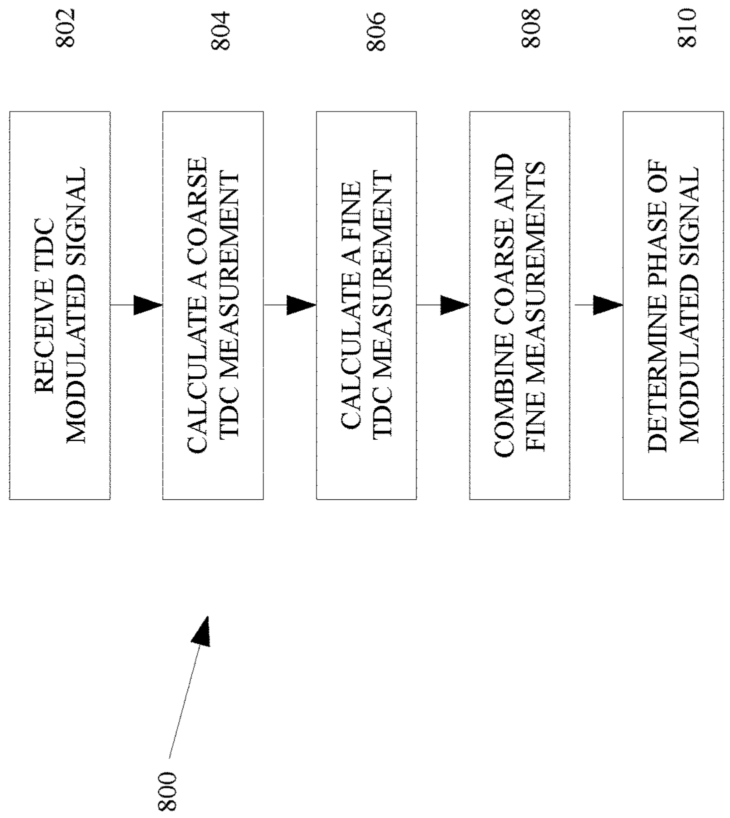
FIG. 8 is a flowchart of a TDC method.

FIG. 8 is a method for calculating the phase of a modulated signal. The TDC method 800 via a reception process 802 receives a signal, which in some embodiments is a frequency division output signal. A course measurement process 804 uses the modulated signal to calculate a coarse measurement for the time to digital value conversion. The coarse measurement process 804 uses a ring oscillator of the TDC circuit to obtain a coarse measurement for the period between a first and a second rising edge of the modulated signal. A fine measurement process 806 calculates a fine measurement of the error in the coarse measurement. The fine measurement process 806 uses a Vernier comparator circuit of the TDC circuit to obtain a fine resolution measurement of a coarse measurement error. A combination process 808 combines the coarse and fine measurements to obtain a digital time measurement. A phase determination process 810 uses the digital time measurement to obtain the phase of the modulated signal.

The invention claimed is:

1. A method comprising:

receiving at a receive time-to-digital conversion (TDC) circuit a modulated signal; using a ring oscillator of the TDC circuit to obtain a coarse measurement of a rising edge of the modulated signal;

using a 2D Vernier comparator circuit of the TDC circuit to obtain a fine resolution measurement of a coarse measurement error representing a difference between a delayed rising edge signal and a delayed coarse measurement signal;

using the coarse measurement and the fine resolution measurement to obtain a digital time measurement; and, determining a phase of the modulated signal based on the digital time measurement.

2. The method of claim 1 wherein obtaining the coarse measurement comprises using the rising edge of the modulated signal to latch output values of each of a plurality of inverters in the ring oscillator.

3. The method of claim 2 wherein obtaining the coarse measurement further comprises identifying a pulse-propagating inverter as an inverter having a non-inverted latched output value.

4. The method of claim 3 further comprising counting a number of complete oscillations of the ring oscillator.

5. The method of claim 4 wherein counting the number of complete oscillations of the ring oscillator comprises:

incrementing a first counter when an output of a first inverter of the ring oscillator changes state;

incrementing a second counter when an output of a second inverter of the ring oscillator changes state; and selecting a count value from either the first counter or the second counter based upon a location of the pulse-propagating inverter in relation to the first inverter and the second inverter.

6. The method of claim 1 further comprising:

initiating the Vernier comparator circuit using the rising edge of the modulated signal; and selecting a stop input for providing a delayed coarse measurement signal to the Vernier comparator circuit using a control logic circuit and a first multiplexer.

7. The method of claim 6 wherein the control logic circuit controls the multiplexer to select a comparator located a predetermined number of delay elements past a pulse-propagating inverter.

8. The method of claim 6 wherein the delayed coarse measurement signal is processed by a delay element and an exclusive OR gate to generate a trigger signal upon a rising edge of the delayed coarse measurement signal.

9. The method of claim 7 wherein initiating the Vernier comparator circuit using the rising edge of the modulated signal comprises delaying the rising edge of the modulated signal using a second multiplexer and a number of delay elements equal to the predetermined number of delay elements.

10. The method of claim 1 wherein calculating the fine resolution measurement of the coarse measurement error comprises:

propagating the rising edge of the modulated signal through a first line of delay elements;

propagating the delayed coarse measurement signal through a second line of delay elements, wherein the first line of delay elements is slower than the second line of delay elements;

determining a fine measurement point using a matrix of arbiters that is a smallest arbiter location in which the delayed coarse measurement signal propagating through the second line of delay elements arrives at the fine measurement point before the rising edge of the modulated signal propagating through the first line of delay elements; and outputting the fine resolution measurement.

11. The method of claim 10 wherein calculating a digital time measurement comprises:

calculating a coarse measurement time as the time of a measured amount of complete oscillations of the ring plus a current propagation time; and calculating a digital time measurement as a coarse measurement count ratio times the coarse measurement time minus the fine resolution measurement plus a calibration correction factor.

12. The method of claim 11 wherein calculating the phase of the modulated signal based on the digital time measurement comprises:

calculating a digital time output as a difference in successive digital time measurements;

determining an output time to write the phase of the modulated signal; calculating a offset digital time output;

scaling the offset digital time output to calculate a scaled digital time signal; and accumulating the scaled digital time signal.

13. The method of claim 12 wherein calculating the digital time output comprises:

subtracting a first digital time measurement from a second digital time measurement to calculate a period difference value; and adding a counter wrapping value to the period difference value when the first digital time measurement is greater than the second digital time measurement.

14. The method of claim 12 wherein determining the output time to write the phase of the modulated signal comprises enabling an output write signal when the digital time output exceeds an output time threshold.

15. The method of claim 12 wherein calculating an offset digital time output comprises subtracting a carrier period offset from the digital time output.

16. An apparatus comprising:

a coarse measurement circuit configured to calculate a coarse measurement of a period of a modulated signal represented by a first rising edge signal and a second rising edge signal, wherein the first rising edge signal and the second rising edge signal are elements of the modulated signal;

a fine measurement circuit configured to calculate a fine resolution measurement of a coarse measurement error representing a difference between the second rising edge signal and a subsequent coarse measurement signal; and a phase calculation circuit configured to calculate the phase of the modulated signal, wherein the phase calculation circuit includes:

an offset digital time output circuit to subtract a carrier period offset from the digital time output;

a scaling circuit to scale a offset digital time output; and an accumulating circuit to accumulate an output signal from the scaling circuit.

17. The apparatus of claim 16 wherein the coarse measurement circuit comprises: a first set of one or more inverters connected to form a ring of inverters;

one or more flip-flops connected to each inverter output in the ring of inverters;

one or more counters connected to one or more of inverter outputs from the first set of inverters;

a first multiplexer which has inputs connected to the inverter outputs from the first set of one or more inverters;

a first exclusive-OR logic gate input connected to the first multiplexer output;

a second set of one or more inverters connected in succession in which the output of the last inverter in the second set of one or more inverters is connected to all inputs of a second multiplexer; and a second exclusive-OR logic gate connected to the second multiplexer output.

18. The apparatus of claim 16 wherein the fine measurement circuit comprises: a set of one or more inverters forming a first line of delay elements;

a set of one or more inverters forming a second line of delay elements, wherein the first line of delay elements is slower than the second line of delay elements;

a matrix of latches equal to the number of inverters in the first line of delay elements times the number of inverters in the second line of delay elements;

a set of connections that connect each inverter output in the first line of delay elements to each first latch input in a column of the matrix of latches; and a set of connections that connect each inverter output in the second line of delay elements to each second latch input in a row of the matrix of latches.

19. The apparatus of claim 16 wherein the phase calculation circuit further comprises:

a digital time difference circuit to calculate a difference in successive period measurements; and a baseband output time circuit to calculate when to write output data.

* * * * *